(12) United States Patent
Yao

(10) Patent No.: US 9,947,888 B2
(45) Date of Patent: Apr. 17, 2018

(54) ORGANIC LIGHT EMITTING DEVICES

(71) Applicant: Shenzhen China Star Optoelectronics Technology Co., Ltd., Shenzhen, Guangdong (CN)

(72) Inventor: Jiangbo Yao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 138 days.

(21) Appl. No.: 14/775,833

(22) PCT Filed: Aug. 25, 2015

(86) PCT No.: PCT/CN2015/088016
§ 371 (c)(1),
(2) Date: Sep. 14, 2015

(87) PCT Pub. No.: WO2016/187978
PCT Pub. Date: Dec. 1, 2016

(65) Prior Publication Data
US 2017/0141346 A1 May 18, 2017

(30) Foreign Application Priority Data

May 27, 2015 (CN) .......................... 2015 1 0280467

(51) Int. Cl.
*H01L 29/08* (2006.01)
*H01L 35/24* (2006.01)
(Continued)

(52) U.S. Cl.
CPC ...... *H01L 51/5228* (2013.01); *H01L 27/3258* (2013.01); *H01L 51/5012* (2013.01);
(Continued)

(58) Field of Classification Search
CPC ............. H01L 51/5228; H01L 51/5012; H01L 51/5209; H01L 51/5225; H01L 2251/558; H01L 27/3258
(Continued)

(56) References Cited

U.S. PATENT DOCUMENTS 6,608,449 B2* 8/2003 Fukunaga ........... H01L 27/3244
313/494
7,999,458 B2* 8/2011 Bae ..................... H01L 27/3251
313/504
(Continued)

FOREIGN PATENT DOCUMENTS

CN 102612858 A 7/2012
CN 103700694 * 12/2013
(Continued)

*Primary Examiner* — Joseph C Nicely
*Assistant Examiner* — Wilner Jean Baptiste
(74) *Attorney, Agent, or Firm* — Andrew C. Cheng

(57) ABSTRACT

An organic light emitting device includes: one thin film transistor (TFT) and a first auxiliary electrode on the first substrate; a second auxiliary electrode being overlapped and being electrically connected with the first auxiliary electrode; a light emitting unit above and being electrically connected with the TFT, the light emitting unit comprising a first and a second pixel electrode, an organic light-emitting layer between the first and the second pixel electrode; wherein the second pixel electrode comprising a first area and a second area connecting with the first area, the first area being above and electrically connecting with the second auxiliary electrode, wherein the organic light-emitting layer being spaced apart from the second auxiliary electrode by a portion between the organic light-emitting layer and the second auxiliary electrode; and wherein tops of the first and the second area of the second pixel electrode are on the same plane.

8 Claims, 1 Drawing Sheet

(51) Int. Cl.
*H01L 51/00* (2006.01)
*H01L 51/52* (2006.01)
*H01L 51/50* (2006.01)
*H01L 27/32* (2006.01)

(52) U.S. Cl.
CPC ...... *H01L 51/5209* (2013.01); *H01L 51/5225* (2013.01); *H01L 2251/558* (2013.01)

(58) Field of Classification Search
USPC .......................................................... 254/40
See application file for complete search history.

(56) References Cited

U.S. PATENT DOCUMENTS

| 8,759,131 | B2* | 6/2014 | Yamazaki | ........... | H01L 27/3244 |
| | | | | | 257/296 |
| 2010/0102335 | A1* | 4/2010 | Takagi | ................ | H01L 27/3276 |
| | | | | | 257/88 |
| 2011/0241001 | A1* | 10/2011 | Omoto | ................ | H01L 27/1214 |
| | | | | | 257/59 |

FOREIGN PATENT DOCUMENTS

| CN | 103700694 A | 4/2014 |
| CN | 104183781 A | 12/2014 |
| KR | 20110035049 A | 4/2011 |

\* cited by examiner

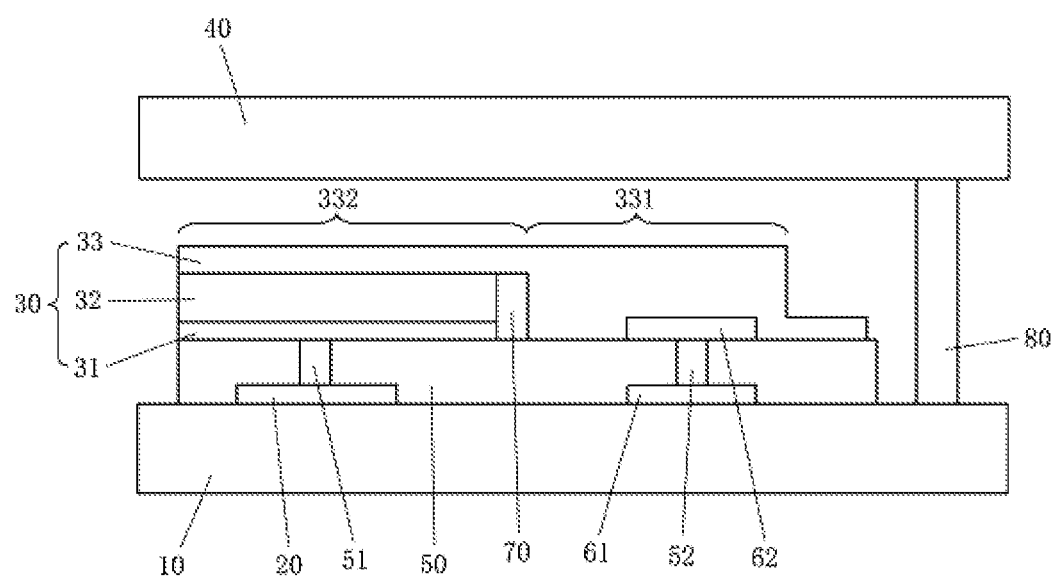

US 9,947,888 B2

ORGANIC LIGHT EMITTING DEVICES

BACKGROUND OF THE INVENTION

1. Field of the Invention

The present disclosure relates to organic light emitting device technology, and more particularly to an organic light emitting device capable of displaying images of uniform brightness.

2. Discussion of the Related Art

Recently, liquid crystal devices (LCDs), organic light emitting devices, electrowetting display device, plasma display panels, and electrophoresis display device have been developed. The organic light emitting devices adopts the organic light emitting diodes (OLEDs) compositing electrons and holes to generate light beams.

The organic light emitting devices may be adopted by devices by personal portable devices, such as MP3 players and mobile phones, and televisions. Such devices are characterized by attributes such as wide viewing angle, high contrast, quick response time, low power consumption and so on.

Conventional organic light emitting devices include a first substrate having OLED and a second substrate opposite to the first substrate for protecting the OLEDs. OLEDs includes organic light emitting layers for emitting light beams and a first pixel electrode and a second pixel electrode opposite to each other, wherein the first pixel electrode and the second pixel electrode are arranged between the light emitting layers.

Currently, OLEDs may be top-emitting, bottom-emitting, and double-side-emitting. With respect to the top-emitting one, the light beams from the OLEDs emit toward the second substrate, and the OLEDs includes a first electrode and a second electrode having light reflective structures. The thickness of the second electrode usually is thinner than that of the first electrode. In addition, the second electrode is made by the transparent conductive material so as to be transflective.

As the thickness of the second electrode is smaller, there is a height difference between the rim and the central portion of the display panel, which may result in voltage dropping. Thus, the brightness of the images displayed by the OLEDs may not be uniform.

SUMMARY

In order to overcome the above problems, the OLED may increase the contact surface between the second pixel electrode and the secondary electrode. This decreases the resistance of the second pixel electrode and the voltage difference of the driving voltage between the rim and the central portion of the display panel. In this way, the brightness of the images displayed by the OLED may be uniform.

In one aspect, an organic light emitting device includes: at least one thin film transistor (TFT) on a first substrate; a first auxiliary electrode on the first substrate;

a second auxiliary electrode being overlapped with the first auxiliary electrode and being electrically connected with the first auxiliary electrode; a light emitting unit above the TFT and being electrically connected with the TFT, the light emitting unit including a first pixel electrode, a second pixel electrode, and an organic light-emitting layer between the first pixel electrode and the second pixel electrode; wherein the second pixel electrode including a first area and a second area connecting with the first area, the first area being above the second auxiliary electrode and electrically connecting with the second auxiliary electrode, and the second area being above the organic light-emitting layer; wherein the organic light-emitting layer being spaced apart from the second auxiliary electrode by a portion of the second pixel electrode between the organic light-emitting layer and the second auxiliary electrode; and wherein tops of the first area and the second area of the second pixel electrode are on the same plane.

Wherein the organic light emitting device further comprises an organic insulated layer being arranged between the first pixel electrode, the organic light-emitting layer, and the second auxiliary electrode, and the organic insulated layer is spaced apart from the second auxiliary electrode, wherein the second area of the second pixel electrode covers the organic insulated layer.

Wherein the organic insulated layer is spaced apart from the second auxiliary electrode by a portion of the first area of the second pixel electrode between the organic light-emitting layer and the second auxiliary electrode.

Wherein the organic insulated layer is adjacent to at least one lateral surface of the first pixel electrode such that the first pixel electrode and the second pixel electrode are insulated from each other.

Wherein the organic insulated layer is adjacent to at least one lateral surface of the organic light-emitting layer.

Wherein the first pixel electrode and the second pixel electrode are formed on the same layer.

Wherein a thickness of the first area of the second pixel electrode is greater than the thickness of the second area of the second pixel electrode.

Wherein the organic light emitting device further comprises a passivation layer between the TFT and the light emitting unit.

Wherein the light emitting unit, the organic insulation layer, and the second auxiliary electrode are formed on the passivation layer.

Wherein the organic insulated layer is between the passivation layer and the second pixel electrode, and organic insulated layer spaces apart the organic light-emitting layer, the first pixel electrode, and the second auxiliary electrode

BRIEF DESCRIPTION OF THE DRAWINGS

FIG. 1 is a schematic view of the pixel of the organic light emitting device in accordance with one embodiment.

DETAILED DESCRIPTION OF THE EMBODIMENTS

Various example embodiments will now be described more fully with reference to the accompanying drawings in which some example embodiments are shown. In the drawings, the thicknesses of layers and regions may be exaggerated for clarity. In the following description, in order to avoid the known structure and/or function unnecessary detailed description of the concept of the invention result in confusion, well-known structures may be omitted and/or functions described in unnecessary detail.

It should be noted that when the member is referred to as "in", "on" another component, this component can be directly on the other member, or the intermediate member may also be present. In contrast, when an element or layer is referred to as being "directly on" "on" another element or layer, no intervening elements or layers present. It should be noted that the relational terms herein, such as "first" and "second", are used only for differentiating one entity or operation, from another entity or operation, which, however do not necessarily require or imply that there should be any real relationship or sequence. Moreover, the terms "comprise", "include" or any other variations thereof are meant to cover non-exclusive including, so that the process, method, article or device comprising a series of elements do not only comprise those elements, but also comprise other elements that are not explicitly listed or also comprise the inherent elements of the process, method, article or device. In the case that there are no more restrictions, an element qualified by the statement "comprises a . . . " does not exclude the presence of additional identical elements in the process, method, article or device that comprises the said element.

FIG. 1 is a schematic view of the pixel of the organic light emitting device in accordance with one embodiment.

Referring to FIG. 1, the organic light emitting device includes a first substrate 10, at least one thin film transistor (TFT) 20, a light emitting unit 30, a packaging unit (not shown), and a second substrate 40.

The first substrate 10 may be a transparent glass substrate made mainly by $SiO_2$. In another example, the first substrate 10 may be substrates, such as plastic substrate or metallic substrate. In addition, the first substrate 10 may be made by, but not limited to, appropriate plastic material capable of implementing a curved surface.

The second substrate 40 is opposite to the first substrate 10. The second substrate 40 may be made by translucent material, and may be made by the same material with the first substrate 10. For instance, the second substrate 40 may be made by, but not limited to, insulated material, such as glass and polymer. The first substrate 10 may be adhered to the TFT substrate 20 by adhesive 80. The TFT 20, the light emitting unit 30, and the packing unit may be arranged between the first substrate 10 and the TFT 20. The first substrate 10 and the second substrate 40 may protect the TFT 20 and the light emitting unit 30 from being affected by outside.

The TFT 20 driving the light emitting unit 30 is arranged on the first substrate 10. In an embodiment, the TFT 20 may include a gate electrode, a source electrode, and a drain electrode (not shown) driving the light emitting unit 30 by the signals transmitted by the light emitting unit 30. The light emitting unit 30 emits the light beams in accordance with the signals received by the TFT 20.

In addition, a first auxiliary electrode 61 is arranged on the first substrate 10. The first auxiliary electrode 61 may be on the same layer with the TFT 20. Though the TFT 20 is arranged on the first substrate 10 in view of the drawings, but it can be understood that the present disclosure is not limited to the above configuration. For instance, the first substrate 10 may include a buffering layer arranged thereon for avoiding penetrated moisture or air outside, and the TFT 20 may be arranged on the buffering layer.

In addition, a passivation layer 50 may be arranged above the TFT 20 of the light emitting unit 30 and the first auxiliary electrode 61 so as to cover the TFT 20 and the first auxiliary electrode 61. In this way, the TFT 20 and the first auxiliary electrode 61 are protected and the TFT 20 and the first auxiliary electrode 61 are planarized.

The passivation layer 50 may be made by any suitable structure. For instance, the passivation layer 50 may be formed as a single layer, double layers, or more than two layers. In other words, the passivation layer 50 may be configured accordingly.

The light emitting unit 30 may be arranged on the passivation layer 50, and the light emitting unit 30 may, but not limited to, face toward the TFT 20. In an example, the light emitting unit 30 may include a first pixel electrode 31 and a second pixel electrode 33 on the passivation layer 50, and an organic light-emitting layer 32 between the first pixel electrode 31 and the second pixel electrode 33. In the embodiment, the first pixel electrode 31 electrically connects to the TFT 20 via a contact hole 51 passing through the passivation layer 50.

In addition, a second auxiliary electrode 62 is arranged on the passivation layer 50, and the second auxiliary electrode 62 overlaps with the first auxiliary electrode 61 on the first substrate 10. In an example, the second auxiliary electrode 62 contact with the first auxiliary electrode 61 via the contact hole 52 passing through the passivation layer 50. The first pixel electrode 31 of the light emitting unit 30 and the second auxiliary electrode 62 are formed on the same layer. In the embodiment, the first pixel electrode 31 and the second auxiliary electrode 62 are formed on the passivation layer 50 and are spaced apart from each other.

As shown in FIG. 1, the first pixel electrode 31 of the light emitting unit 30 electrically connect to the TFT 20 of the light emitting unit 30. For instance, the first pixel electrode 31 may electrically connect to the drain electrode (not shown) of the TFT 20. The organic light-emitting layer 32 may be on the first pixel electrode 31. In addition, the organic light-emitting layer 32 may include light-emitting material for emitting the red, green, and blue lights. The organic light-emitting layer 32 may, but not limited to, face toward the first pixel electrode 31. In the embodiment, the organic light-emitting layer 32 has not overlapped with the second auxiliary electrode 62, and the organic light-emitting layer 32 is spaced apart from the second auxiliary electrode 62 for a certain distance.

An organic insulated layer 70 is arranged on the passivation layer 50, and abuts against the first pixel electrode 31 and the organic light-emitting layer 32 so as to form a lateral surface of the first pixel electrode 31 and the organic light-emitting layer 32. In the embodiment, the organic insulated layer 70 may be formed between the organic light-emitting layer 32, the first pixel electrode 31, and the second pixel electrode 33. The organic insulated layer 70 is spaced apart from the second auxiliary electrode 62. The organic insulated layer 70 may be, but not limited to, substantially cuboid. The second pixel electrode 33 may be arranged above the organic light-emitting layer 32, the organic insulated layer 70, the passivation layer 50 and the second auxiliary electrode 62.

In the embodiment, the organic insulated layer 70 may be spaced apart from the second auxiliary electrode 62 via the second pixel electrode 33. The second pixel electrode 33 covers a top surface and lateral surfaces of the second auxiliary electrode 62. In addition, the second pixel electrode 33 isolates the organic insulated layer 70 from the second auxiliary electrode 62. Thus, the second pixel electrode 33 electrically connects to the second auxiliary electrode 62, and the second pixel electrode 33 receives voltage via the first auxiliary electrode 61 and the second auxiliary electrode 62. In the embodiment, the organic insulated layer 70 prevents the organic light-emitting layer 32 from being contacted by the second auxiliary electrode 62, and prevents the first pixel electrode 31 from being electrically connected with the second pixel electrode 33. In addition, the organic insulated layer 70 reserves a gap for the second pixel electrode 33. The second pixel electrode 33 may be arranged between the organic insulated layer 70 and the second auxiliary electrode 62, and the second pixel electrode 33 contacts with the second auxiliary electrode 62 to increase the contact surface between the second pixel electrode 33 and the second auxiliary electrode 62, which decreases the resistance.

The first pixel electrode 31 and the second pixel electrode 33 may be overlapped with each other. In addition, the first pixel electrode 31 is insulated from the organic light-emitting layer 32 due to the organic light-emitting layer 32.

In the embodiment, the first pixel electrode 31 may be a reflective electrode or a reflective layer for reflecting the light beams emitted from the organic light-emitting layer 32 toward the second pixel electrode 33. The second pixel electrode 33 may also be, but not limited to, a reflective electrode. For instance, the second pixel electrode 33 may be a transmission electrode.

The second pixel electrode 33 may include a first area 331 and a second area 332 connecting with one end of the first area 331. The top of the first area 331 aligns with the top of the second area 332. The second area 332 may be above the top of the organic light-emitting layer 32 and the organic insulated layer 70. The first area 331 may be above the top of the passivation layer 50 and the second auxiliary electrode 62. The thickness of the first area 331 is larger than the thickness of the second area 332.

In view of the above, the tops of the first area and the second area of the second pixel electrode are aligned. In addition, by configuring the organic insulated layer, there is no groove generated between the first area and the second area of the second pixel electrode, and the groove may be harmful for decreasing the resistance of the second pixel electrode. With such configuration, the resistance between the first area and the second area may be decreased, and the total resistance of the second pixel electrode may also be decreased. The voltage dropping of the driving voltage between the rim and the central portion of the display panel may be decreased, and thus the brightness of the images displayed by the OLEDs may be uniform.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An organic light emitting device, comprising:
   at least one thin film transistor (TFT) on a first substrate;
   a first auxiliary electrode on the first substrate;
   a second auxiliary electrode being overlapped with the first auxiliary electrode and being electrically connected with the first auxiliary electrode;
   a light emitting unit above the TFT and being electrically connected with the TFT, the light emitting unit comprising a first pixel electrode, a second pixel electrode, and an organic light-emitting layer between the first pixel electrode and the second pixel electrode;
   wherein the second pixel electrode comprising a first area and a second area connecting with the first area, the first area being above the second auxiliary electrode and electrically connecting with the second auxiliary electrode, and the second area being above the organic light-emitting layer;
   wherein the organic light-emitting layer being spaced apart from the second auxiliary electrode by a portion of the second pixel electrode between the organic light-emitting layer and the second auxiliary electrode;
   wherein tops of the first area and the second area of the second pixel electrode are on the same plane;
   wherein a passivation layer between the TFT and the light emitting unit, the first pixel electrode electrically connects to the TFT via a contact hole passing through the passivation layer, the second auxiliary electrode contacts with the first auxiliary electrode via the contact hole passing through the passivation layer; and
   wherein the organic light emitting device further comprises an organic insulated layer being arranged between the first pixel electrode, the organic light-emitting layer, and the second auxiliary electrode, and the organic insulated layer is spaced apart from the second auxiliary electrode, wherein the second area of the second pixel electrode covers the organic insulated layer.

2. The organic light emitting device as claimed in claim 1, wherein the organic insulated layer is spaced apart from the second auxiliary electrode by a portion of the first area of the second pixel electrode between the organic light-emitting layer and the second auxiliary electrode.

3. The organic light emitting device as claimed in claim 1, wherein the organic insulated layer is adjacent to at least one lateral surface of the first pixel electrode such that the first pixel electrode and the second pixel electrode are insulated from each other.

4. The organic light emitting device as claimed in claim 3, wherein the organic insulated layer is adjacent to at least one lateral surface of the organic light-emitting layer.

5. The organic light emitting device as claimed in claim 1, wherein the first pixel electrode and the second pixel electrode are formed on the same layer.

6. The organic light emitting device as claimed in claim 5, wherein a thickness of the first area of the second pixel electrode is greater than the thickness of the second area of the second pixel electrode.

7. The organic light emitting device as claimed in claim 1, wherein the light emitting unit, the organic insulation layer, and the second auxiliary electrode are formed on the passivation layer.

8. The organic light emitting device as claimed in claim 7, wherein the organic insulated layer is between the passivation layer and the second pixel electrode, and organic insulated layer spaces apart the organic light-emitting layer, the first pixel electrode, and the second auxiliary electrode.

* * * * *